United States Patent
Nishiguchi

(10) Patent No.: US 10,453,930 B2
(45) Date of Patent: Oct. 22, 2019

(54) SEMICONDUCTOR DEVICE AND METHOD FOR MANUFACTURING THE SAME

(71) Applicant: KABUSHIKI KAISHA TOSHIBA, Tokyo (JP)

(72) Inventor: Toshifumi Nishiguchi, Hakusan Ishikawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 22 days.

(21) Appl. No.: 15/694,836

(22) Filed: Sep. 3, 2017

(65) Prior Publication Data

US 2018/0308943 A1 Oct. 25, 2018

(30) Foreign Application Priority Data

Apr. 21, 2017 (JP) .................. 2017-084656

(51) Int. Cl.
| | |
|---|---|
| H01L 29/40 | (2006.01) |
| H01L 29/78 | (2006.01) |
| H01L 21/28 | (2006.01) |
| H01L 29/66 | (2006.01) |
| H01L 29/423 | (2006.01) |
| H01L 29/08 | (2006.01) |

(52) U.S. Cl.
CPC ...... *H01L 29/407* (2013.01); *H01L 21/28008* (2013.01); *H01L 29/0878* (2013.01); *H01L 29/42368* (2013.01); *H01L 29/42376* (2013.01); *H01L 29/66734* (2013.01); *H01L 29/7813* (2013.01)

(58) Field of Classification Search
CPC .................................................. H01L 29/407
See application file for complete search history.

(56) References Cited

U.S. PATENT DOCUMENTS

| | | |
|---|---|---|
| 9,472,630 B2 | 10/2016 | Parthasarathy et al. |
| 9,716,009 B2 | 7/2017 | Kobayashi et al. |
| 2016/0093719 A1* | 3/2016 | Kobayashi ........ H01L 21/28008 257/330 |

FOREIGN PATENT DOCUMENTS

| | | |
|---|---|---|
| JP | 5087816 B2 | 12/2012 |
| JP | 2016-072482 A | 5/2016 |

* cited by examiner

*Primary Examiner* — Moazzam Hossain
*Assistant Examiner* — Hajar Kolahdouzan
(74) *Attorney, Agent, or Firm* — Kim & Stewart LLP

(57) ABSTRACT

A semiconductor device includes a first electrode, a first semiconductor layer on the first electrode, a second semiconductor layer on the first semiconductor layer, a third semiconductor layer on the second semiconductor layer, a second electrode in electrical contact with the third semiconductor layer, a gate electrode, a first insulating film between the side surface of the third semiconductor layer and the gate electrode, a field plate electrode, and a second insulating film. The field plate has an upper portion adjacent to the gate electrode and a lower portion having a width less than a width of the upper portion. The second insulating film has a first portion between the field plate electrode's upper portion and the first semiconductor layer and a second portion between the field plate electrode's lower portion and the first semiconductor layer, the second portion having a width greater than the width of the first portion.

14 Claims, 15 Drawing Sheets ial is not limited to silicon but can be, for example, silicon
SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2017-084656, filed Apr. 21, 2017, the entire contents of which are incorporated herein by reference.

FIELD

Embodiments described herein relate generally to a semiconductor device and a method for manufacturing the same.

BACKGROUND

Examples of proposed semiconductor devices for electric power control include a metal-oxide semiconductor field-effect transistor (MOSFET) structure which is equipped with a field plate electrode located below a gate electrode. Moreover, they also include a structure in which the width of a field plate electrode becomes smaller, stepwise, in a depth direction.

DETAILED DESCRIPTION

Figure 1:
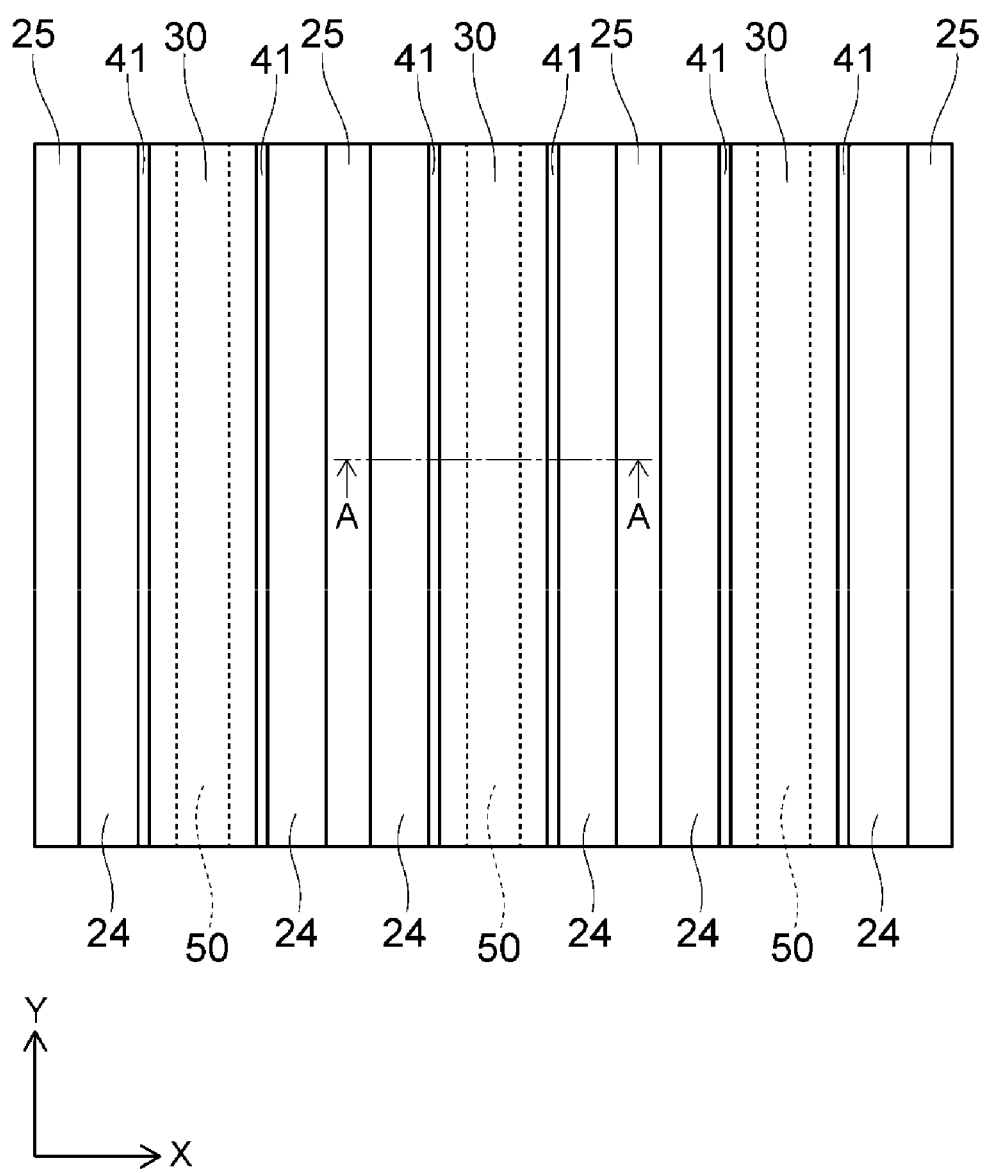
FIG. 1 is a schematic plan view of a semiconductor device according to an embodiment.

An exemplary embodiment provides a semiconductor device with low on-state resistance and high withstand voltage and a method for manufacturing the same.

In general, according to one embodiment, a semiconductor device includes a first electrode, a first semiconductor layer of a first conductivity type on the first electrode, a second semiconductor layer of a second conductivity type on the first semiconductor layer, a third semiconductor layer of the first conductivity type on the second semiconductor layer, a second electrode in electrical contact with the third semiconductor layer, a gate electrode located opposite to a side surface of the third semiconductor layer, a first insulating film between the side surface of the third semiconductor layer and the gate electrode, a field plate electrode below the gate electrode and including an upper portion adjacent to the gate electrode and a lower portion closer to the first electrode than the upper portion, the lower portion having a width less than a width of the upper portion, and a second insulating film between the first semiconductor layer and the field plate electrode and including a first portion between the upper portion of the field plate electrode and the first semiconductor layer and a second portion between the lower portion of the field plate electrode and the first semiconductor layer, the second portion having a width greater than the width of the first portion. The first semiconductor layer includes a first region, and a second region adjacent to a side wall of the second insulating film between the first region and the side wall of the second insulating film and having a first conductivity type impurity concentration higher than that of the first region.

Hereinafter, an embodiment will be described with reference to the drawings. Furthermore, in the drawings, the same elements are assigned the same reference characters.

While, in the description of the following embodiment, the first conductivity type is assumed to be N type and the second conductivity type is assumed to be P type, the first conductivity type can be assumed to be P type and the second conductivity type can be assumed to be N type.

Furthermore, in the embodiment, the semiconductor material is assumed to be silicon, the semiconductor material is not limited to silicon but can be, for example, silicon carbide, gallium nitride, or gallium oxide.

Moreover, in the following embodiment, the impurity concentration can also be considered to be the "carrier concentration" or "dopant concentration". The carrier concentration can be deemed to be an effective impurity concentration.

FIG. 1 is a schematic plan view of a semiconductor device according to the embodiment.

Figure 2:
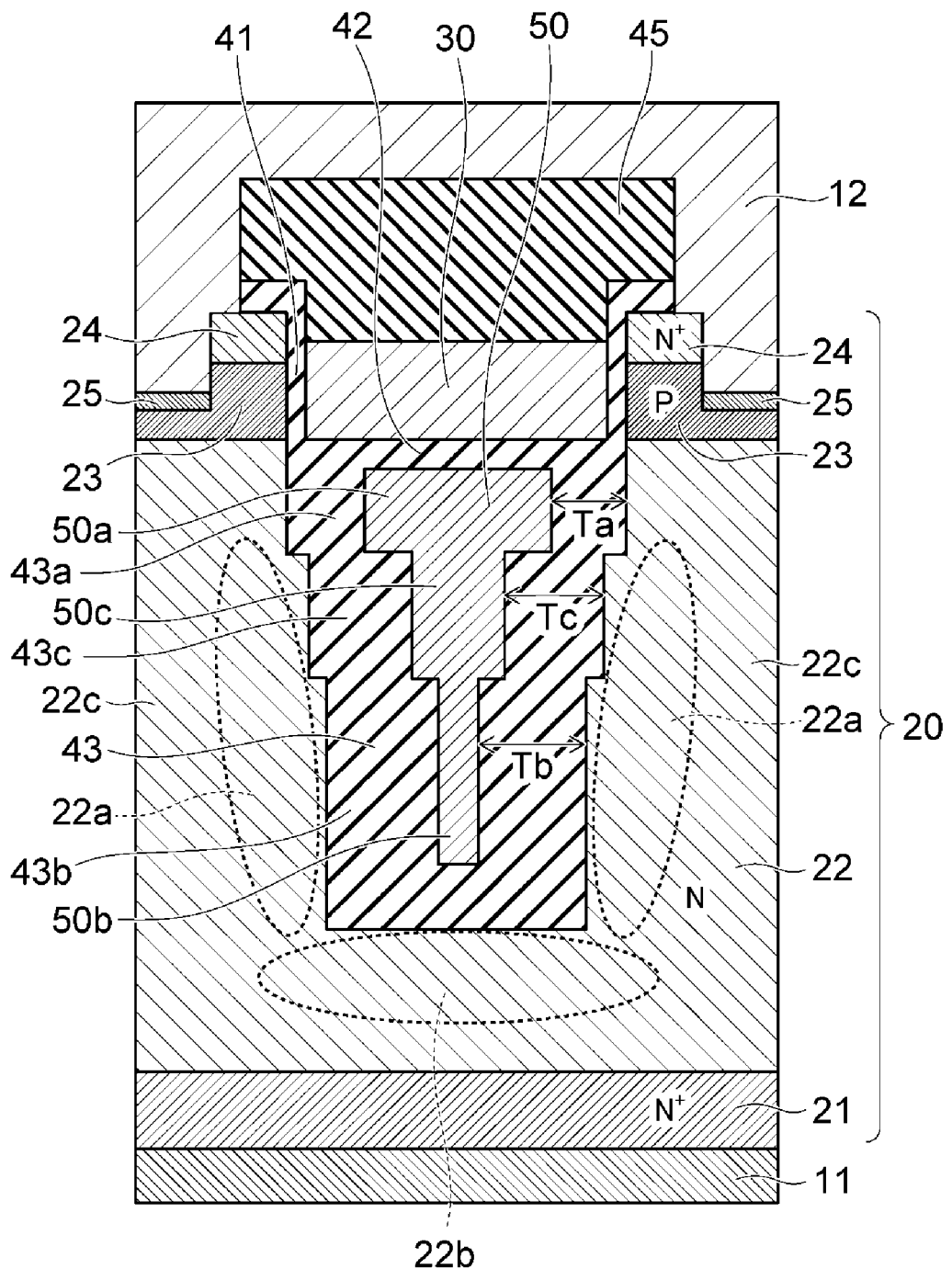
FIG. 2 is a sectional view taken along line A-A in FIG. 1.

FIG. 2 is a sectional view taken along line A-A in FIG. 1.

FIG. 1 illustrates a planar layout (or plan view) of a gate electrode 30, an insulating film 41, a source layer 24, and a base contact region 25 from among the elements illustrated in FIG. 2. Furthermore, a field plate electrode 50, which is provided below the gate electrode 30, is indicated by dashed lines in FIG. 1.

The semiconductor device according to the embodiment is a vertical semiconductor device in which, as illustrated in FIG. 2, a semiconductor layer 20 is provided between a drain electrode 11 serving as a first electrode and a source electrode 12 serving as a second electrode and current flows along the direction connecting the drain electrode 11 and the source electrode 12 (along the vertical direction). The semiconductor layer 20 is a silicon layer.

The X direction and Y direction illustrated in FIG. 1 indicate respective directions perpendicular to each other in a plane parallel to a principal surface of the semiconductor layer 20.

As illustrated in FIG. 1, a plurality of gate electrodes 30, a plurality of insulating films 41, a plurality of source layers 24, and a plurality of base contact regions 25 are periodically arranged in the X direction. The gate electrode 30, the insulating film 41, the source layer 24, and the base contact region 25 are formed in a stripe-shaped pattern, with the stripes extending in the Y direction. Furthermore, a base layer 23 illustrated in FIG. 2 also extends in the Y direction below the source layer 24 and the base contact region 25.

In a single unit including one gate electrode 30 as illustrated in FIG. 2, the gate electrode 30 is located between a pair of source layers 24 (and a pair of base layers 23). The insulating film 41 is located between the source layers 24 (and the base layer 23) and the gate electrode 30.

As illustrated in FIG. 2, the semiconductor layer 20 includes a first semiconductor layer, which includes an $N^+$-type drain layer 21 and an N-type drift layer 22, a P-type base layer 23, an $N^+$-type source layer 24, and a $P^+$-type base contact region 25.

The N-type impurity concentration of each of the drain layer 21 and the source layer 24 is higher than the N-type impurity concentration of the drift layer 22. The P-type impurity concentration of the base contact region 25 is higher than the P-type impurity concentration of the base layer 23.

The drain layer 21 is provided on the drain electrode 11 and is in contact with the drain electrode 11. The drift layer 22 is provided on the drain layer 21. The base layer 23 is provided on the drift layer 22. The source layer 24 is provided on the base layer 23. The base contact region 25 is provided on the surface of a region on which the source layer 24 is not provided in the base layer 23.

The gate electrode 30 is located between a side surface of adjacent base layers 23. The insulating film 41 is also provided between the gate electrode 30 and the side surface of the base layer 23. An interlayer insulating film 45 is provided on the gate electrode 30.

The source electrode 12 is provided in such a way as to cover the interlayer insulating film 45, and the source electrode 12 is in contact with the source layer 24 and the base contact region 25.

The field plate electrode 50 is provided below the gate electrode 30. In the example illustrated in FIG. 2, an insulating film 42 is provided between the gate electrode 30 and the field plate electrode 50, so that the gate electrode 30 and the field plate electrode 50 are locally electrically isolated from each other.

The field plate electrode 50 is provided in the drift layer 22, and an insulating film 43 is provided between the field plate electrode 50 and the drift layer 22. The field plate electrode 50 is not in contact with the drift layer 22. The insulating film 43 is a silicon dioxide film.

The width of the field plate electrode 50 in the x-direction is not uniform in the vertical direction (depth direction from the source electrode 12 to the drain electrode 11) but varies stepwise in the vertical direction. The width of the field plate electrode 50 becomes smaller stepwise in the direction from an upper portion 50a thereof closer to the gate electrode 30 toward a lower portion 50b thereof closer to the drain electrode 11. The side wall of the field plate electrode 50 has stair-shaped steps along the vertical direction.

The field plate electrode 50 has at least two respective different widths in the x-direction. In the example illustrated in FIG. 2, the field plate electrode 50 has three respective different widths in the x-direction. In other words, the field plate electrode 50 includes an upper portion 50a, a lower portion 50b, and an intermediate portion 50c.

The upper portion 50a is located closer to the gate electrode 30 than is the lower portion 50b, the lower portion 50b located closer to the drain electrode 11 than is the upper portion 50a, and the width of the lower portion 50b is smaller than the width of the upper portion 50a. The intermediate portion 50c is provided between the upper portion 50a and the lower portion 50b, and the width of the intermediate portion 50c in the x-direction is smaller than the width of the upper portion 50a in the x-direction and is larger than the width of the lower portion 50b in the x-direction. Two or more intermediate portions having two or more respective different widths in the x-direction can be provided between the upper portion 50a and the lower portion 50b.

The insulating film 43 includes a first portion 43a provided between the upper portion 50a of the field plate electrode 50 and the drift layer 22, a second portion 43b provided between the lower portion 50b of the field plate electrode 50 and the drift layer 22, and an intermediate portion 43c provided between the intermediate portion 50c of the field plate electrode 50 and the drift layer 22.

The film thickness of the insulating film 43 becomes greater stepwise in the direction from the first portion 43a closer to the gate electrode 30 toward the second portion 43b closer to the drain electrode 11. The film width Tb in the x-direction of the second portion 43b is greater than the film width Ta in the first direction of the first portion 43a. The film width Tc in the x-direction of the intermediate portion 43c is greater than the film width Ta in the first direction of the first portion 43a and is less than the film width Tb in the x-direction of the second portion 43b. In the example illustrated in FIG. 2, the side wall of the insulating film 43 has stair-shaped steps along the vertical direction.

While a two-step change in film thickness difference of the insulating film 43 is illustrated in FIG. 2, the film thickness difference of the insulating film 43 can be changed to at least three steps. Furthermore, the insulating film 43 can have a change in film thickness difference in four or more steps.

The drift layer 22 includes a first region 22c and a second region 22a provided between the first region 22c and the side wall of the insulating film 43. The second region 22a is provided along the side wall of the insulating film 43 in a region adjacent to the side wall of the insulating film 43. The N-type impurity concentration of the second region 22a is higher than the N-type impurity concentration of the first region 22c.

The second region 22a has a concentration gradient of the N-type impurity in the direction along the side wall of the insulating film 43. The N-type impurity concentration of the second region 22a becomes higher stepwise or in a continuous manner in the direction from the first portion 43a of the insulating film 43 toward the second portion 43b of the insulating film 43, i.e., the N-type impurity concentration decreases in the second region 22a in the depth direction of the device from the source electrode 12 to the drain electrode 11.

The N-type impurity concentration of the portion of the second region 22a adjacent to the first portion 43a of the insulating film 43 is lower than the N-type impurity concentration of the portion of the second region 22a adjacent to the second portion 43b of the insulating film 43.

The drift layer 22 further includes a third region 22b provided therein adjacent to the bottom of the insulating film 43 and having an N-type impurity concentration higher than that of the first region 22c. The N-type impurity concentration of the third region 22b is higher than the N-type impurity concentration of the portion of the second region 22a adjacent to the first portion 43a of the insulating film 43.

In the above-described semiconductor device, an electrical potential difference is applied between the drain electrode 11 and the source electrode 12. An electrical potential applied to the drain electrode 11 is higher than an electrical potential applied to the source electrode 12. The field plate electrode 50 is electrically connected to the source electrode 12, and the same electrical potential applied to the source electrode 12 is applied to the field plate electrode 50.

During an ON-operation of the semiconductor device, an electrical potential equal to or higher than a threshold voltage is applied to the gate electrode 30, so that an inversion layer (an N-type channel) is formed in a region opposite to the gate electrode 30 in the base layer 23. Then, a current flows between the drain electrode 11 and the source electrode 12 via the drain layer 21, the drift layer 22, the channel, and the source layer 24.

When the electrical potential of the gate electrode 30 becomes an electrical potential lower than the threshold voltage, the channel is cut off, so that the semiconductor device enters an off-state. During this off-state, a depletion layer spreads in the entire drift layer 22 from a P-N junction between the base layer 23 and the drift layer 22 and from a boundary between the insulating film 43 and the drift layer 22, so that the withstand voltage of the semiconductor device can be maintained.

The field plate electrode 50 moderates a change in electrical potential in the vertical direction in the drift layer 22. Then, since the film thickness of the insulating film 43 formed between the field plate electrode 50 and the drift layer 22 becomes greater stepwise in the direction from the source electrode 12 toward the drain electrode 11, the electric field strength distribution in the vertical direction in the drift layer 22 can be set to an approximately flat distribution. This increases an integrated value of electric field strengths in the vertical direction in the drift layer 22 and improves the withstand voltage.

Furthermore, in the drift layer 22, the N-type impurity concentration of the region 22a, which is adjacent to the side wall of the insulating film 43, is higher than the N-type impurity concentration of the other region 22c. Accordingly, a current pathway which is low in resistance along the vertical direction is formed in the drift layer 22, so that an on-state resistance can be reduced.

Moreover, the N-type impurity concentration of the region 22b, which is adjacent to the bottom of the insulating film 43, is also higher than the N-type impurity concentration of the first region 22c, and a part of the third region 22b also spreads below the second region 22a. Therefore, a region between the second region 22a and the drain layer 21 can also be made low in resistance.

According to the semiconductor device in the embodiment, while the impurity concentration of a portion of the drift layer 22 is made higher, a decrease in withstand voltage can be reduced or prevented by the effect of the insulating film 43 having the above-described differences in film thickness over its depth. In other words, according to the embodiment, a semiconductor device satisfying both a low on-state resistance and a high withstand voltage can be provided.

Next, a method for manufacturing the semiconductor device according to the embodiment is described with reference to FIG. 3A to FIG. 11.

Figure 3A:
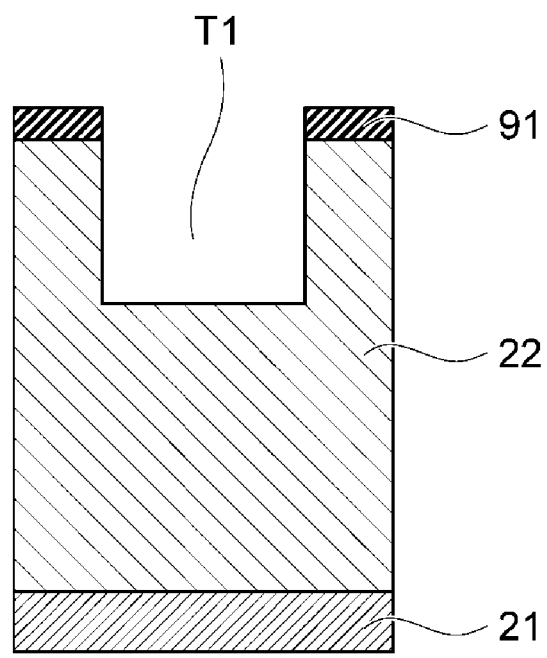
FIGS. 3A and 3B are schematic sectional views illustrating a method for manufacturing the semiconductor device according to the embodiment.

As illustrated in FIG. 3A, a trench T1 is formed in the drift layer 22. For example, the trench T1 is formed according to a reactive ion etching (RIE) method using a patterned mask layer 91 formed on the surface of the drift layer 22.

Figure 3B:
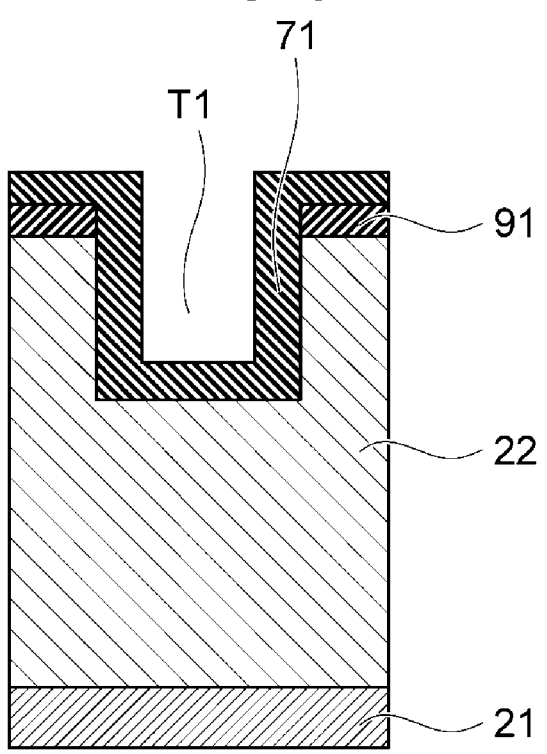

As illustrated in FIG. 3B, a side wall film 71 is formed in the trench T1. The side wall film 71 is, for example, a silicon dioxide film. The side wall film 71 is formed in a conformal manner along the upper surface of the mask layer 91 and the side wall and bottom of the trench T1.

Figure 4A:
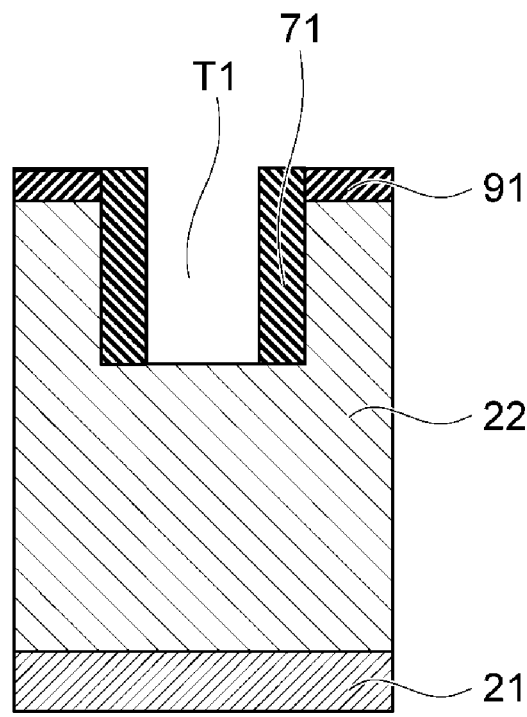
FIGS. 4A and 4B are schematic sectional views illustrating the method for manufacturing the semiconductor device according to the embodiment.

Next, as illustrated in FIG. 4A, a portion of the side wall film 71 formed on the bottom of the trench T1 is removed by the RIE method. A portion of the side wall film 71 formed on the mask layer 91 is also removed. The drift layer 22 is exposed at the bottom of the trench T1.

Figure 4B:
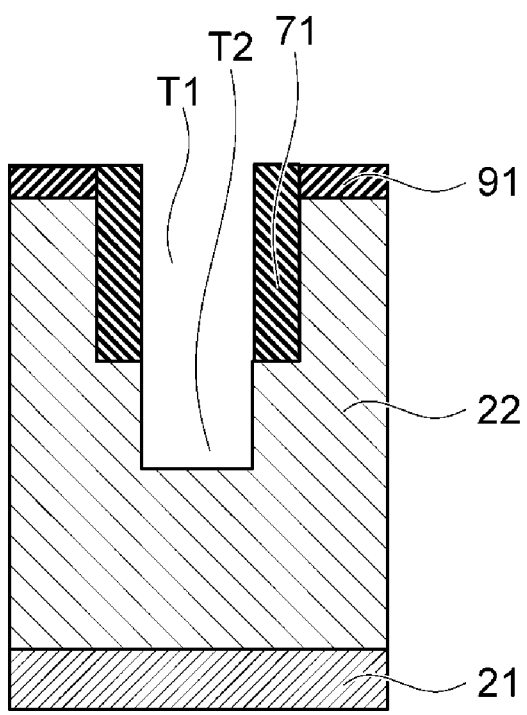

Next, as illustrated in FIG. 4B, a trench T2 is formed extending inwardly of the drift layer 22 from the base of the trench T1. The trench T2 is formed according to the RIE method using the mask layer 91 and the side wall film 71 as masks. The width of the trench T2 is smaller than the width of the trench T1.

Figure 5A:
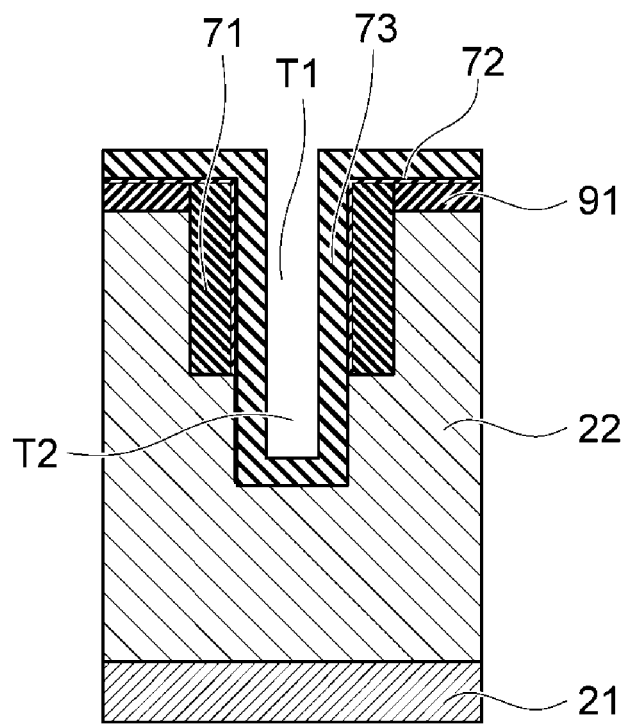
FIGS. 5A and 5B are schematic sectional views illustrating the method for manufacturing the semiconductor device according to the embodiment.

Next, as illustrated in FIG. 5A, an etch stop film 72 is formed on the upper surface of the mask layer 91 and the side surface of the side wall film 71 in the trench T1. After that, a side wall film 73 is formed over the side wall film 71 in the trench T1 and in the trench T2. The side wall film 73 is formed in a conformal manner along the upper surface of the mask layer 91, the side surface of the side wall film 71, and the side wall and bottom of the trench T2. For example, the etch stop film 72 is a silicon nitride film, and the side wall film 73 is a silicon dioxide film. The etch stop stopper film 72 is formed between the mask layer 91 and the side wall film 73 and between the side wall film 71 and the side wall film 73.

Figure 5B:
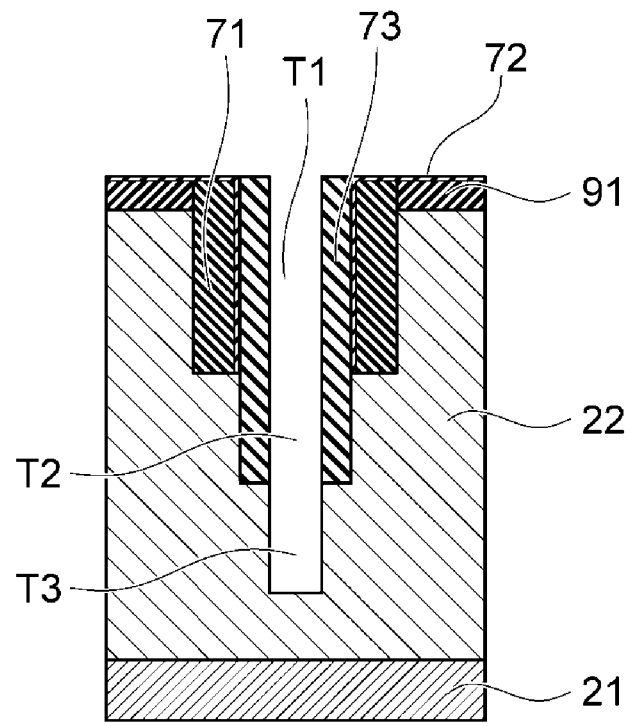

Next, after a portion of the side wall film 73 formed on the bottom of the trench T2 is removed according to, for example, the RIE method, as illustrated in FIG. 5B, a trench T3 is formed inwardly of drift region 22 from the base of the trench T2. When a portion of the side wall film 73 on the bottom of the trench T2 is removed, a portion of the side wall film 73 above the mask layer 91 is also removed. At this time, a portion of the etch stop film 72 on the mask layer 91 functions as an etching stop.

The trench T3 is formed according to the RIE method using the etch stop film 72 and the side wall film 73 as masks. The width of the trench T3 is smaller than each of the width of the trench T1 and the width of the trench T2.

Figure 6A:
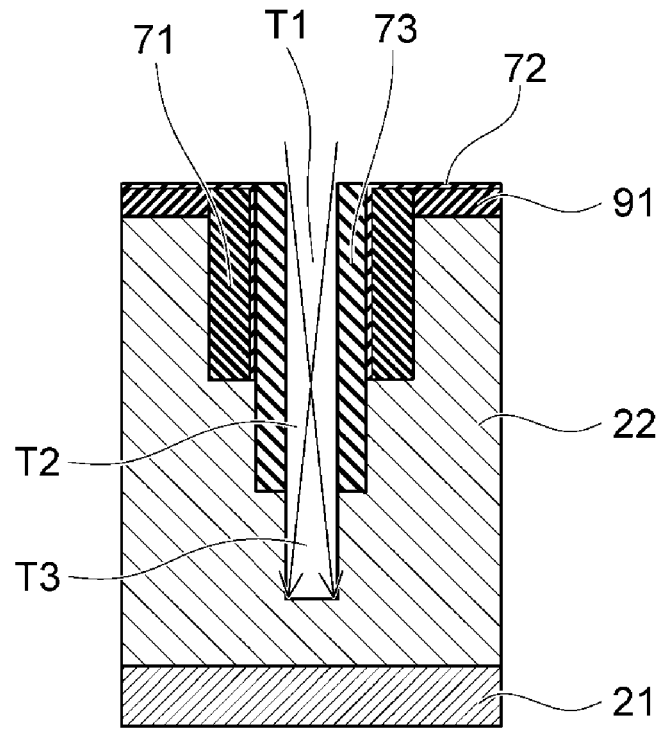
FIGS. 6A and 6B are schematic sectional views illustrating the method for manufacturing the semiconductor device according to the embodiment.
Figure 10:
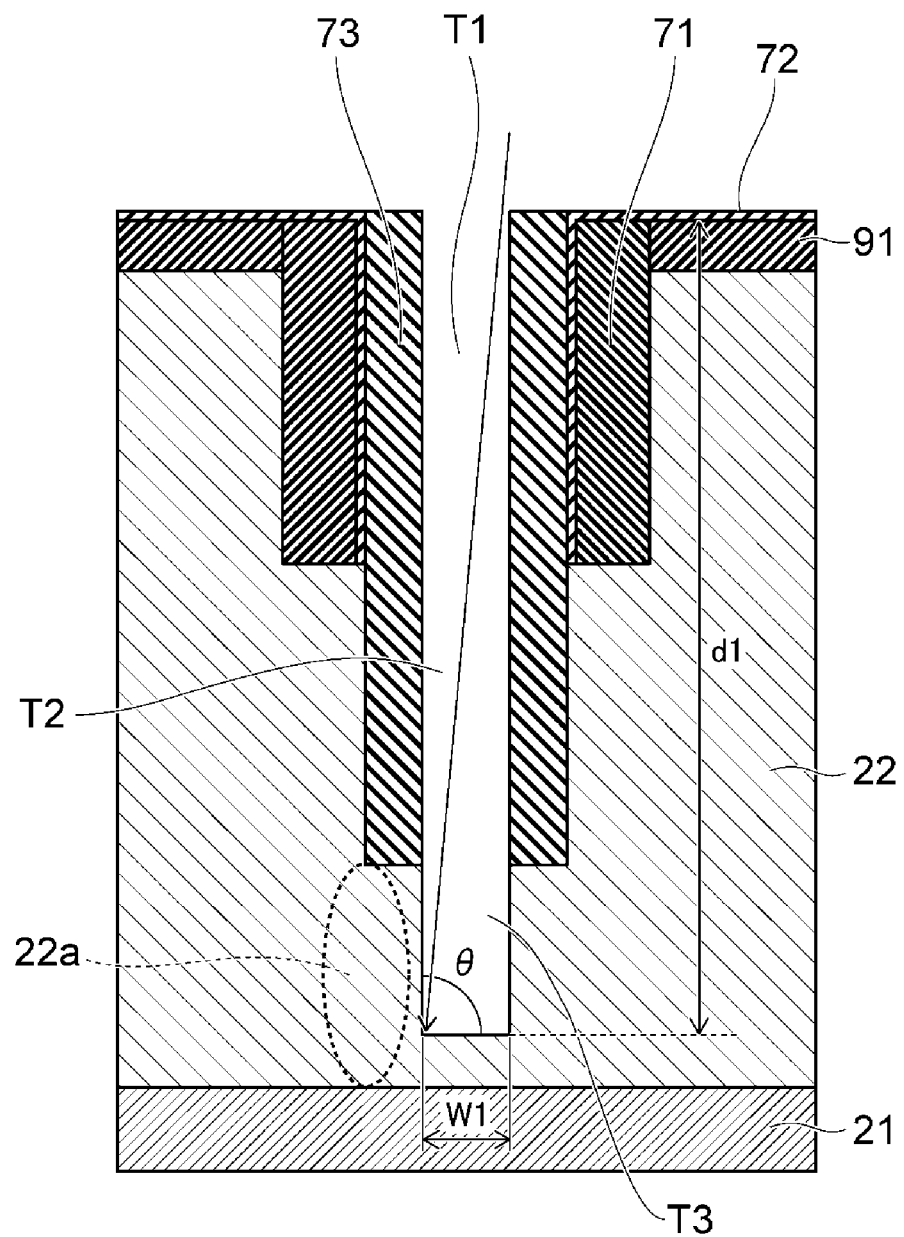
FIG. 10 is a schematic sectional view illustrating the method for manufacturing the semiconductor device according to the embodiment.

Next, as illustrated in FIG. 6A and FIG. 10, for example, arsenic or phosphorus serving as an N-type impurity is implanted into the side wall of the trench T3 according to an ion implantation method. The impurity is implanted into the side wall of the trench T3 from a direction inclined relative to the principal surface of the semiconductor layer (e.g., the drain layer 21 and the drift layer 22). In a region adjacent to the side wall of the trench T3 in the drift layer 22, a region 22a having an N-type impurity concentration higher than the N-type impurity concentration of the drift layer 22 not yet subjected to ion implantation is formed. The impurity is also implanted into the drift layer below the bottom of the trench T3.

Referring to FIG. 10, where the width of the trench T3 is denoted by W1 and the total depth of the trenches T1 to T3 is denoted by dl, the angle of incidence θ of the impurity to the side wall of the trench T3 can be defined by "θ=tan$^{-1}$ (d1/W1)".

At this time, since the side wall of the trench T1 is covered by the side wall film 71 and the side wall film 73 and the side wall of the trench T2 is covered by the side wall film 73, the impurity is not implanted into the drift layer 22 at the side walls of the trench T1 and the drift layer 22 at the side walls of the trench T2.

Figure 6B:
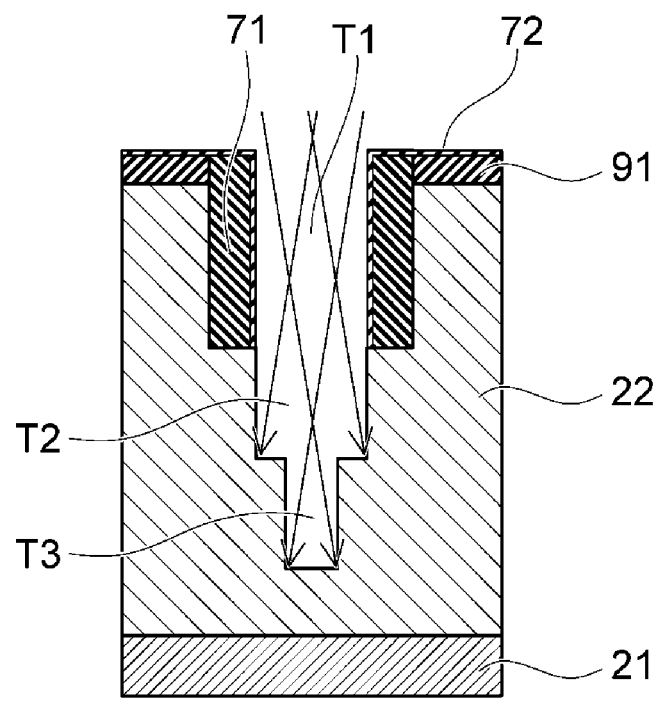

Next, the side wall film 73 is removed. With the side wall film 73 removed, the side wall of the trench T2 is exposed as illustrated in FIG. 6B and FIG. 11.

Then, an N-type impurity, such as arsenic or phosphorus, is implanted into the side wall of the trench T2 according to the ion implantation method. At this time, too, the impurity is implanted into the drift layer 22 along the side walls of the trench T2 from a direction inclined relative to the principal surface of the semiconductor layer (e.g., the drain layer 21 and the drift layer 22). In a region adjacent to the side walls of the trench T2 in the drift layer 22, a region 22a having an N-type impurity concentration higher than the N-type impurity concentration of the drift layer 22 not yet subjected to ion implantation is formed.

At this time, the side wall of the trench T1 is covered by the side wall film 71 and the side wall film 73, so that the impurity is not implanted into the drift layer adjacent to the side walls of the trench T1.

Figure 11:
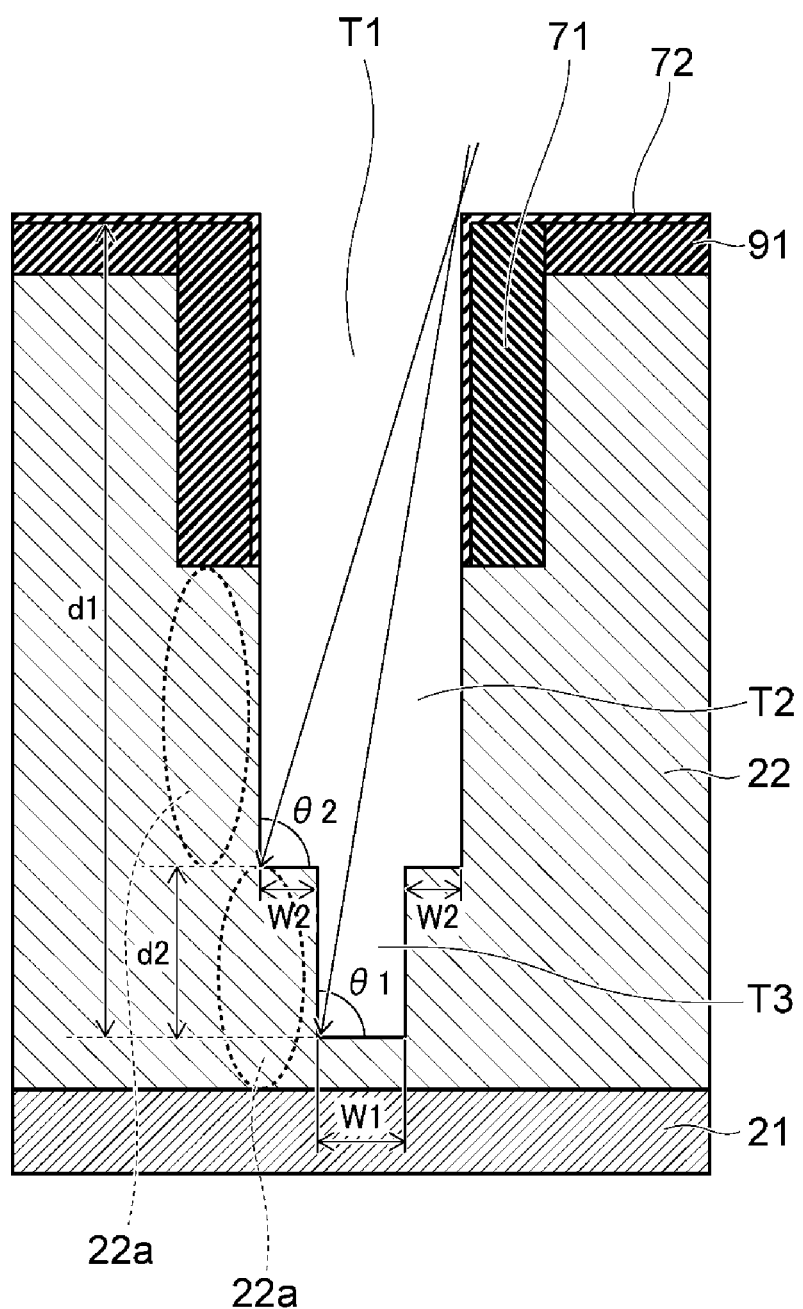
FIG. 11 is a schematic sectional view illustrating the method for manufacturing the semiconductor device according to the embodiment.

Referring to FIG. 11, when the width of the trench T3 is denoted by W1, the width between the side wall of the trench T2 and the side wall of the trench T3 is denoted by W2, the total depth of the trenches T1 to T3 is denoted by d1, and the depth of the trench T3 is denoted by d2, the angle of incidence θ2 of the impurity to the side wall of the trench T2 can be defined by "θ2=tan$^{-1}$ ((d1−d2)/(W1+W2×2))".

Furthermore, the impurity can be implanted into the drift layer 22 along the side walls of the trench T2 and the side walls of the trench T3 simultaneously. The angle of incidence θ1 can be defined by "θ1=tan$^{-1}$ (d1/(W1+W2))".

In either case, through the process illustrated in FIG. 10 and FIG. 11, the N-type impurity concentration of a portion of the drift layer 22 adjacent to the side wall of the trench T3 is made higher than the N-type impurity concentration of a portion of the drift layer 22 adjacent to the side wall of the trench T2. After ion implantation, a heat treatment for diffusing the implanted impurity within the drift layer 22 is performed.

After that, the side wall film 71, the stopper film 72, and the mask layer 91 remaining in the state illustrated in FIG. 6B are removed. With these films removed, a trench T in which the trenches T1 to T3 are connected in the depth direction in such way as to form steps appears as illustrated in FIG. 7A.

The width of the trench T becomes smaller stepwise in the depth direction, and the side wall of the trench T has stair-shaped steps along the depth direction.

Figure 7A:
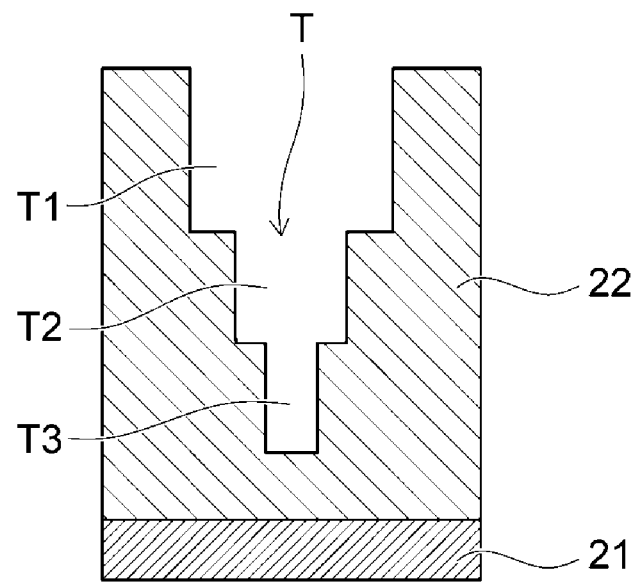
FIGS. 7A and 7B are schematic sectional views illustrating the method for manufacturing the semiconductor device according to the embodiment.

While, in the example illustrated in FIG. 7A, the trench T having three widths is illustrated, the trench T only need only have at least two widths.

In the case of a trench T having three widths, the inclined ion implantation for the first time illustrated in FIG. 6A is performed on the side wall of the trench T3 located on the relatively lower side, and, after that, the inclined ion implantation for the second time illustrated in FIG. 6B is performed on the side wall of the trench T2 located on the relatively upper side thereof.

Figure 7B:
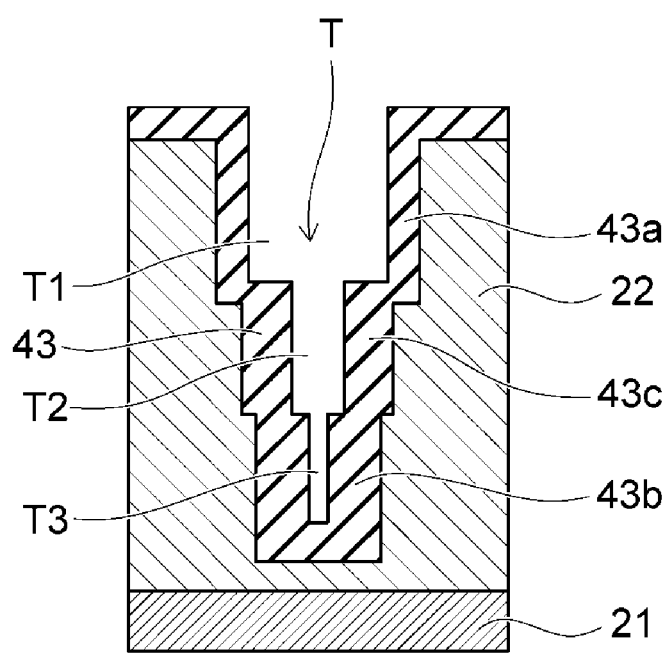

Next, a thermal -oxidation reaction is performed on the portion of the drift layer 22, which is a silicon layer, exposed at the side walls and bottom of the trench T, so that an insulating film 43, which is a silicon dioxide film, is grown on the side wall of the trench T as illustrated in FIG. 7B. The insulating film 43 is also grown on the bottom of the trench T and the upper surface of the drift layer 22.

The thermal oxidation rate of a silicon layer depends on the impurity concentration of the silicon layer. The higher impurity concentration a portion has, the higher the thermal oxidation rate of that portion. Under the condition that the thermal oxidation treatment the same throughout the trench T, the higher impurity concentration a portion has, the greater the thickness of the silicon dioxide film grown in that portion becomes.

In a region of the drift layer 22 adjacent to the side wall of the trench T, a density gradient of the N-type impurity concentration is formed in the depth direction of the drift layer. The N-type impurity concentration of a region in the drift layer 22 adjacent to the side wall of the trench T3 is higher than the N-type impurity concentration of a region in the drift layer 22 adjacent to the side wall of the trench T2, and the N-type impurity concentration of a region in the drift layer 22 adjacent to the side wall of the trench T2 is higher than the N-type impurity concentration of a region in the drift layer 22 adjacent to the side wall of the trench T1

Accordingly, the film thickness of the second portion 43b of the insulating film 43 growing on the side wall of the trench T3 becomes greater than the film thickness of the intermediate portion 43c of the insulating film 43 growing on the side wall of the trench T2, and the film thickness of the intermediate portion 43c of the insulating film 43 growing on the side wall of the trench T2 becomes greater than the film thickness of the first portion 43a of the insulating film 43 growing on the side wall of the trench T1. The film thickness of the insulating film 43 is resultantly greater stepwise in the depth direction of the trench T.

Figure 12:
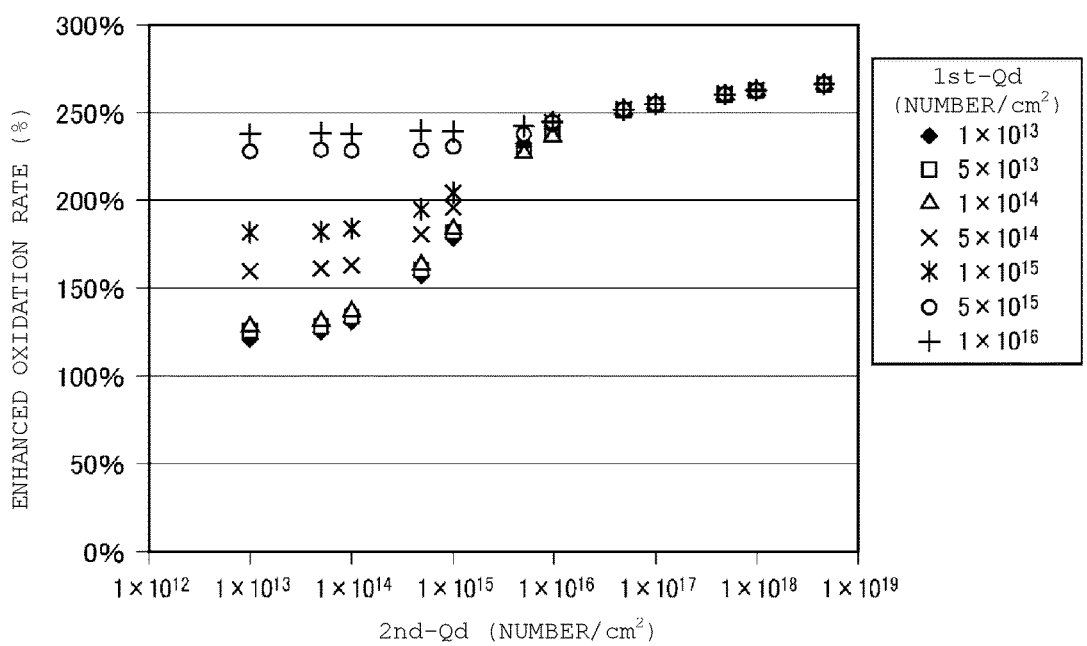
FIG. 12 is a graph illustrating a simulation result of impurity dose amount dependency of an enhanced oxidation rate.

FIG. 12 is a graph illustrating a simulation result of the dependency of an enhanced oxidation rate of silicon as a result of the impurity dose.

The ordinate axis represents a relative enhanced oxidation rate (%) which is based on the growth rate of the first portion 43a of the insulating film 43.

The abscissa axis represents an impurity dose amount for the second implanted dose 2nd-Qd (number/cm$^2$) illustrated in FIG. 6B and FIG. 11. In the graph, an impurity dose amount for the first implanted dose 1st-Qd (number/cm$^2$) illustrated in FIG. 6A and FIG. 10 is plotted. In both the first implanted dose and the second implanted dose, arsenic implanted at an acceleration voltage of 10 keV is employed.

According to the simulation result illustrated in FIG. 12, in a case where the impurity dose amount 2nd-Qd for the side wall of the trench T2 is set to $1 \times 10^{15}$ (number/cm$^2$), the impurity dose amount 2nd-Qd for the side wall of the trench T3 is set to $1 \times 10^{15}$ (number/cm$^2$), and the impurity dose amount 1st-Qd for the side wall of the trench T3 is set to $5 \times 10^{15}$ (number/cm$^2$), the film thickness Tc of the intermediate portion 43c of the insulating film 43 can be resultantly be 1.8 times the film thickness Ta of the first portion 43a thereof, and the film thickness Tb of the second portion 43b thereof can resultantly be 2.38 times the film thickness Ta of the first portion 43a thereof.

Figure 8A:
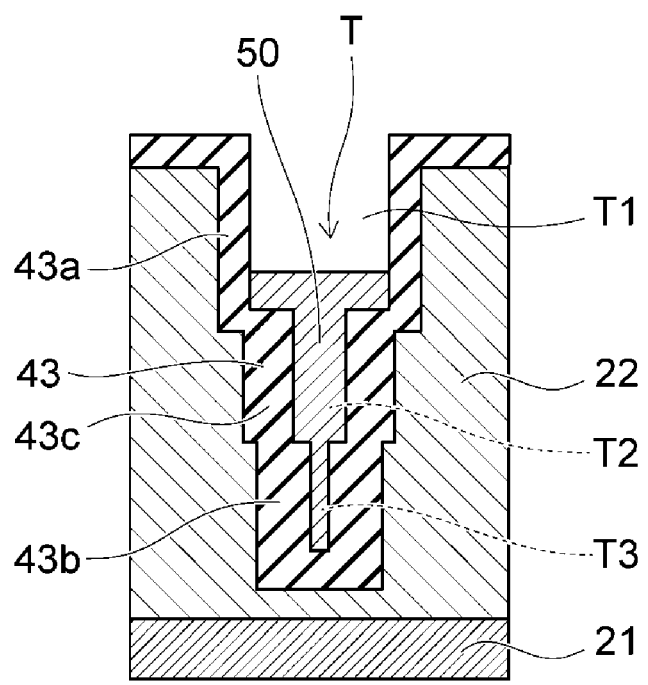
FIGS. 8A and 8B are schematic sectional views illustrating the method for manufacturing the semiconductor device according to the embodiment.

After the insulating film 43 is formed, polycrystalline silicon, for example, serving as an electrode material, is embedded in the cavity remaining inside the insulating film 43 in the trench T. The upper surface of the polysilicon is recessed inwardly of the trench T by, for example, etching back, and a stepped field plate electrode 50 is formed in the trench T as illustrated in FIG. 8A.

Figure 8B:
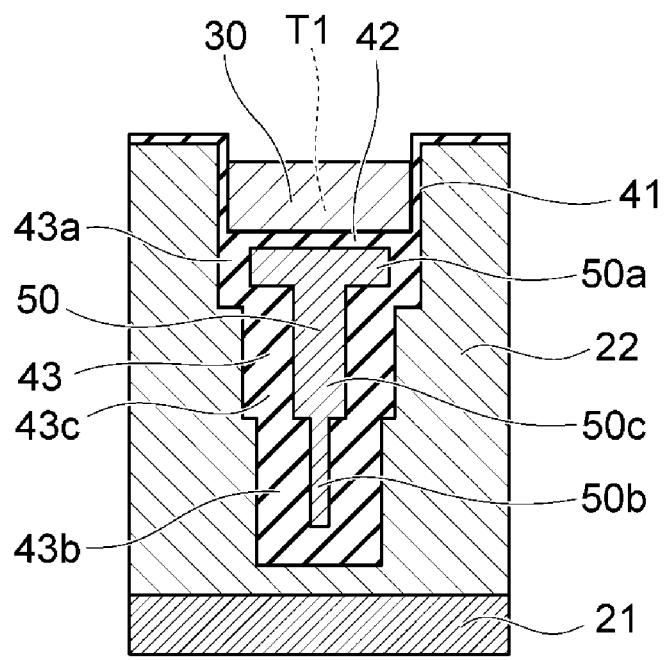

After an insulating film 42 is formed on the upper surface of the field plate electrode 50 as illustrated in FIG. 8B, a gate electrode 30 made from, for example, polycrystalline silicon is formed in the trench T on the insulating film 42.

Figure 9A:
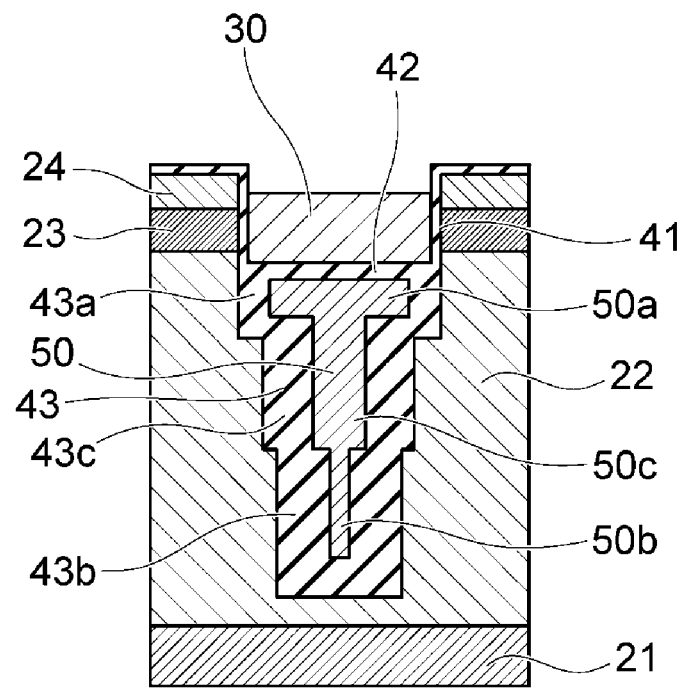
FIGS. 9A and 9B are schematic sectional views illustrating the method for manufacturing the semiconductor device according to the embodiment.

After that, a P-type impurity is implanted into the drift layer 22, so that a P-type base layer 23 is formed on the surface of the drift layer 22 as illustrated in FIG. 9A. Then, an N-type impurity is implanted into the surface of the base layer 23, so that an N-type source layer 24 is formed on the base layer 23.

Figure 9B:
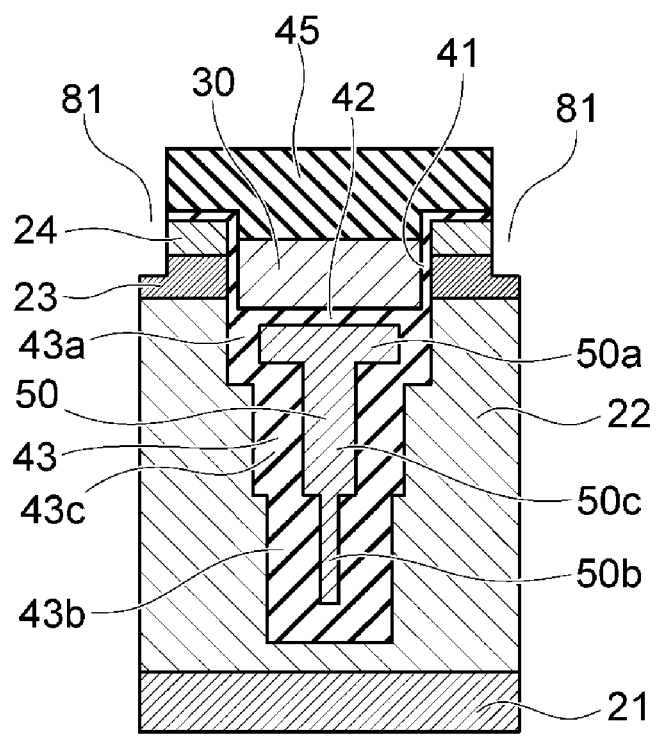

After that, as illustrated in FIG. 9B, an interlayer insulating film 45 is formed on the gate electrode 30 and the source layer 24. Contact trenches 81 are formed in the interlayer insulating film 45, the source layer 24, and inwardly of the base layer 23, and land in the base layer 23. The contact trench 81 penetrates through the interlayer insulating film 45 and the source layer 24 and then extends to a midway portion of the base layer 23.

After the base contact region 25 illustrated in FIG. 2 is formed on the surface of the base layer 23 corresponding to the bottom of the contact trench 81, the source electrode 12 is formed in the contact trench 81. The source electrode contacts the side surface of the source layer 24. Furthermore, the interlayer insulating film 45 can be recessed in the x-direction so that the source electrode 12 contacts the upper surface of the source layer 24.

According to the above-described method for manufacturing the semiconductor device according to the embodiment, when an impurity is implanted into the drift region along the side walls of the trenches T2 and T3 from an oblique direction, no impurity is implanted into a region of the drift layer 22 from which the base layer 23 or the source layer 24 are formed. Therefore, the controllability of channel resistance or threshold voltage is not influenced.

Figure 13:
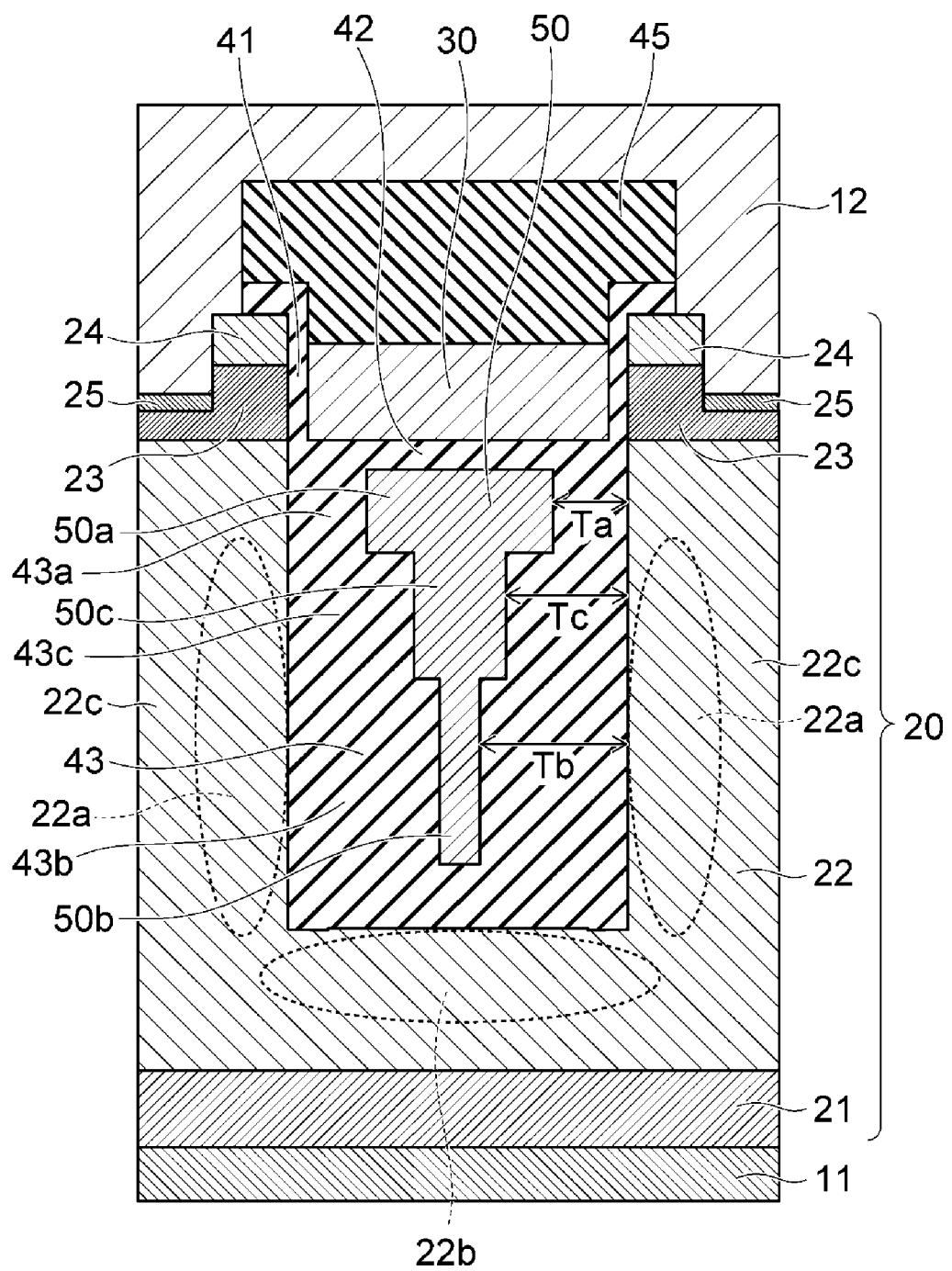
FIG. 13 is a schematic sectional view of a semiconductor device according to the embodiment.

FIG. 13 is a schematic sectional view illustrating another example of a semiconductor device according to the embodiment.

Controlling a thermal oxidation condition during formation of the insulating film 43 also allows no steps to be formed on the side wall of the insulating film 43, i.e., along the interface of the insulating film and the drift layer 22 in the depth direction, as illustrated in FIG. 13. Here, the dopant profile in the drift layer 22 is varied in the depth direction.

Figure 14:
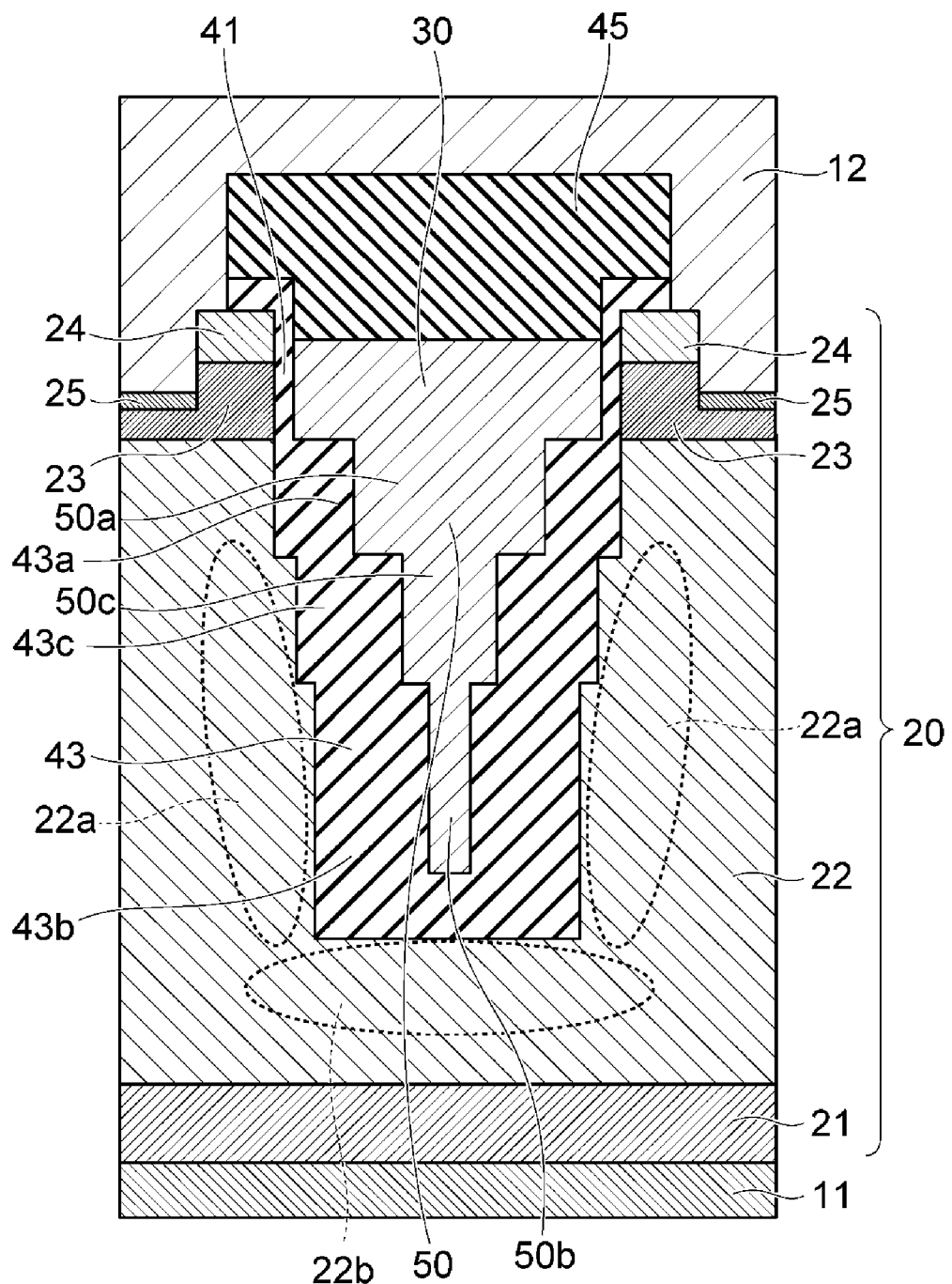
FIG. 14 is a schematic sectional view of a semiconductor device according to the embodiment.

FIG. 14 is a schematic sectional view illustrating yet another example of a semiconductor device according to the embodiment.

In the example illustrated in FIG. 14, the field plate electrode 50 is made from the same material (for example, polycrystalline silicon) as that of the gate electrode 30 and is provided integrally with the gate electrode 30. Accordingly, the same electric potential as that of the gate electrode 30 is applied to the field plate electrode 50.

Figure 15A:
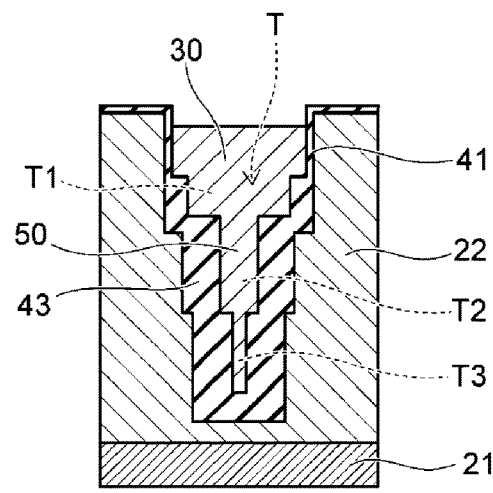
FIGS. 15A, 15B, and 15C are schematic sectional views illustrating a method for manufacturing the semiconductor device illustrated in FIG. 14.
Figure 15B:
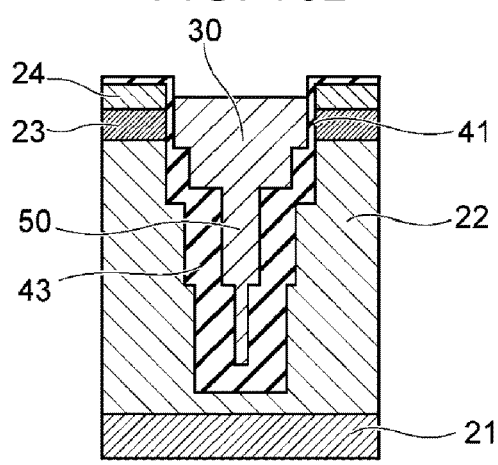
Figure 15C:
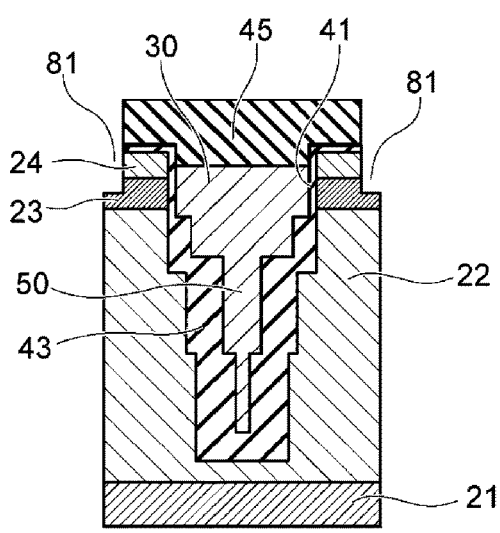

FIGS. 15A to 15C are schematic sectional views illustrating a method for manufacturing the semiconductor device illustrated in FIG. 14.

After the method is performed in a way similar to that in the above-described embodiment until the process illustrated in FIG. 7B, an electrode material serving as the field plate electrode 50 and the gate electrode 30 is embedded in the trench T as illustrated in FIG. 15A. The uppermost surface of the electrode material is caused to be located near the uppermost surface of the drift layer 22.

After that, a P-type impurity is implanted into the upper surface of the drift layer 22, so that a P-type base layer 23 is formed on the surface of the drift layer 22 as illustrated in FIG. 15B. Moreover, an N-type impurity is implanted into the surface of the base layer 23, so that an N-type source layer 24 is formed over the base layer 23.

After that, a contact trenches 81 are formed as illustrated in FIG. 15C, and the base contact region 25 and the source electrode 12 illustrated in FIG. 14 are subsequently formed.

While, in the above-described embodiment, a semiconductor device of the MOSFET structure is illustrated by an example, a semiconductor device of the insulated gate bipolar transistor (IGBT) structure can also be used. The semiconductor device of the IGBT structure further includes a $P^+$-type layer, for example, between the electrode 11 and the $N^+$-type layer 21 in FIG. 2, 13, or 14.

According to the semiconductor device in the embodiment, the field plate electrode is electrically connected to the second electrode.

According to the semiconductor device in the embodiment, the field plate electrode is provided integrally with the gate electrode.

According to the semiconductor device in the embodiment, the second insulating film is a silicon dioxide film.

The method for manufacturing the semiconductor device according to the embodiment includes, as a process for forming the steps on the side wall of the trench, forming an upper trench, forming a first side wall film on a side wall of the upper trench, and forming a lower trench having a width smaller than that of the upper trench under the upper trench by anisotropy etching using the first side wall film as a mask.

The method for manufacturing the semiconductor device according to the embodiment includes, as a process for implanting the impurity into the semiconductor layer, implanting an impurity into a region adjacent to a side wall of the lower trench in the semiconductor layer with the side wall of the upper trench covered with the first side wall film, and implanting an impurity into a region adjacent to the side wall of the upper trench in the semiconductor layer after removing the first side wall film.

The method for manufacturing the semiconductor device according to the embodiment further includes implanting an impurity into the region adjacent to the side wall of the lower trench in the semiconductor layer after removing the first side wall film.

The method for manufacturing the semiconductor device according to the embodiment further includes forming a semiconductor layer of the second conductivity type on a surface of the semiconductor layer of the first conductivity type after forming the insulating film, and forming a semiconductor layer of the first conductivity type on a surface of the semiconductor layer of the second conductivity type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a first electrode;
a first semiconductor layer of a first conductivity type on the first electrode;
a second semiconductor layer of a second conductivity type on the first semiconductor layer;

a third semiconductor layer of the first conductivity type on the second semiconductor layer;
a second electrode in electrical contact with the third semiconductor layer;
a gate electrode;
a first insulating film between a side surface of the third semiconductor layer and the gate electrode;
a field plate electrode below the gate electrode and including an upper portion adjacent to the gate electrode and a lower portion closer to the first electrode than the upper portion, the lower portion having a width less than a width of the upper portion; and
a second insulating film between the first semiconductor layer and the field plate electrode and including a first portion between the upper portion of the field plate electrode and the first semiconductor layer and a second portion between the lower portion of the field plate electrode and the first semiconductor layer, the second portion having a width greater than the width of the first portion,
wherein the first semiconductor layer includes
a first region, and
a second region adjacent to a side wall of the second insulating film between the first region and the side wall of the second insulating film and having a first conductivity type impurity concentration higher than that of the first region.

2. The semiconductor device according to claim 1, wherein the side wall of the second insulating film has stair-shaped steps in a direction connecting the first electrode and the second electrode.

3. The semiconductor device according to claim 2, wherein the first conductivity type impurity concentration in the second region of the first semiconductor layer adjacent to the first portion of the second insulating film is lower than the first conductivity type impurity concentration in the second region adjacent to the second portion of the second insulating film.

4. The semiconductor device according to claim 3, wherein the first semiconductor layer further includes a third region adjacent to the bottom of the second insulating film, and having a first conductivity type impurity concentration higher than that of the first region.

5. The semiconductor device according to claim 2, wherein the first semiconductor layer further includes a third region located adjacent to the bottom of the second insulating film and having a first conductivity type impurity concentration higher than that of the first region.

6. The semiconductor device according to claim 1, wherein a first conductivity type impurity concentration of a region adjacent to the first portion of the second insulating film in the second region of the first semiconductor layer is lower than a first conductivity type impurity concentration of a region adjacent to the second portion of the second insulating film in the second region of the first semiconductor layer.

7. The semiconductor device according to claim 1, wherein the first semiconductor layer further includes a third region adjacent to the bottom of the second insulating film and having a first conductivity type impurity concentration higher than that of the first region.

8. A semiconductor device comprising:
a first electrode;
a first semiconductor layer of a first conductivity type on the first electrode;
a second semiconductor layer of a second conductivity type on the first semiconductor layer;
a third semiconductor layer of the first conductivity type on the second semiconductor layer;
a second electrode in electrical contact with the third semiconductor layer;
a gate electrode between side surfaces of the third semiconductor layer;
a first insulating film between one of the side surfaces of the third semiconductor layer and the gate electrode; and
a field plate electrode below the gate electrode and within a second insulating film disposed in the first semiconductor layer, the field plate electrode including an upper portion and a lower portion, the upper portion closer to the gate electrode than the lower portion, the lower portion closer to the first electrode than the upper portion and having a width less than a width of the upper portion, and the second insulating film including a first portion between the upper portion of the field plate electrode and the first semiconductor layer and a second portion between the lower portion of the field plate electrode and the first semiconductor layer, the second portion having a thickness greater than a thickness of the first portion,
wherein the first semiconductor layer includes
a first region, and
a second region adjacent to a side wall of the second insulating film between the first region and the side wall of the second insulating film and having a first conductivity type impurity concentration higher than that of the first region.

9. The semiconductor device according to claim 8, wherein the side wall of the second insulating film has stair-shaped steps along a direction connecting the first electrode and the second electrode.

10. The semiconductor device according to claim 9, wherein a first conductivity type impurity concentration of the portion of the second region of the first semiconductor layer adjacent to the first portion of the second insulating film is lower than a first conductivity type impurity concentration of the portion of the second region of the first semiconductor layer adjacent to the second portion of the second insulating film.

11. The semiconductor device according to claim 10, wherein the first semiconductor layer further includes a third region adjacent to the bottom of the second insulating film and having a first conductivity type impurity concentration higher than that of the first region.

12. The semiconductor device according to claim 9, wherein the first semiconductor layer further includes a third region adjacent to the bottom of the second insulating film and having a first conductivity type impurity concentration higher than that of the first region.

13. The semiconductor device according to claim 8, wherein a first conductivity type impurity concentration of a region adjacent to the first portion of the second insulating film in the second region of the first semiconductor layer is lower than a first conductivity type impurity concentration of a region adjacent to the second portion of the second insulating film in the second region of the first semiconductor layer.

14. The semiconductor device according to claim 8, wherein the first semiconductor layer further includes a third region provided in a region adjacent to a bottom of the second insulating film and having a first conductivity type impurity concentration higher than that of the first region.

* * * * *